(12) United States Patent
Loos et al.

(10) Patent No.: US 12,211,663 B2
(45) Date of Patent: Jan. 28, 2025

(54) CHARGE CARRIER GENERATION SOURCE

(71) Applicant: scia Systems GmbH, Chemnitz (DE)

(72) Inventors: Enrico Loos, Hohenstein-Ernstthal (DE); Matthias Nestler, Nossen (DE)

(73) Assignee: SCIA SYSTEMS GMBH (DE)

( * ) Notice: Subject to any disclaimer, the term of this patent is extended or adjusted under 35 U.S.C. 154(b) by 406 days.

(21) Appl. No.: 17/806,293

(22) Filed: Jun. 10, 2022

(65) Prior Publication Data
US 2022/0406559 A1 Dec. 22, 2022

(51) Int. Cl.
*H01J 37/08* (2006.01)
*H01J 37/305* (2006.01)

(52) U.S. Cl.
CPC .......... *H01J 37/08* (2013.01); *H01J 37/3053* (2013.01); *H01J 2237/083* (2013.01)

(58) Field of Classification Search
CPC ... H01J 37/08; H01J 37/3053; H01J 2237/083
See application file for complete search history.

(56) References Cited

U.S. PATENT DOCUMENTS

2008/0128268 A1* 6/2008 Lopatin .................... C25D 7/08
204/192.1

FOREIGN PATENT DOCUMENTS

| DE | 69615804 T2 | 6/2002 |
|---|---|---|
| JP | 264031 A | 12/1985 |
| JP | 2019-075264 A | 5/2019 |

OTHER PUBLICATIONS

Notice of Reasons for Refusal issued by the Japanese Patent Office in application No. 2022-094238, May 30, 2023.
Notice of Reasons for Refusal issued by the Japanese Patent Office in application No. 2022-094238, Nov. 7, 2023.
Burdovitsin, et al., "Hollow-cathode plasma electron gun for beam generation at forepump gas pressure", Review of Scientific Instruments, 70, 2975 (1999), 6 pages.

* cited by examiner

*Primary Examiner* — Nicole M Ippolito
*Assistant Examiner* — Hanway Chang
(74) *Attorney, Agent, or Firm* — BARNES & THORNBURG LLP; Jeffrey R. Stone (57) ABSTRACT

A carrier generation source is provided, comprising a carrier generation area configured to provide carriers and a grid electrode, the grid electrode comprising an electrically conductive carrier, the carrier having a first side and a second side opposite the first side, the first side being directly adjacent the carrier generation area, the carrier having a plurality of through-holes extending from the first side through the carrier to the second side, the through-holes on the first side each having a first opening surface and the through-holes on the second side having a second opening surface, the first opening surface being larger than the second opening surface.

14 Claims, 7 Drawing Sheets

CHARGE CARRIER GENERATION SOURCE

The invention relates to a charge carrier generation source.

In industry, processes are used to treat the surface of a coated semiconductor or other component surface, for example, when the surface of a component has unevenness and the surface deviates from a target shape (i.e., from a target surface), for example, has too much or too little material.

Various surface treatments are based, for example, on directional charge carrier beams. Charge carrier beams consist of electrical charge carriers, e.g. ion beams or electron beams.

Figure 1:
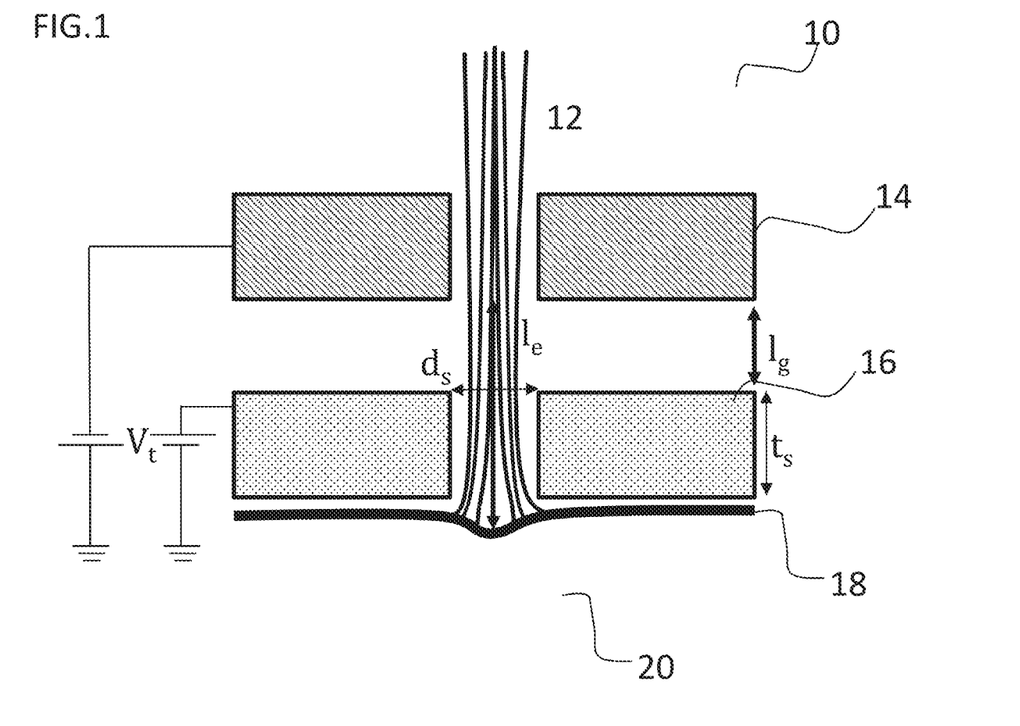
FIG. 1 is a device according to the related technique.

FIG. 1 schematically illustrates a section of a conventional charge carrier beam source 10. Charge carrier beams 12 are generated in a charge carrier beam source 10 by extracting electric charge carriers, for example ions or electrons, from a carrier generation area 20, for example a plasma. After leaving the carrier generation area 20, the charge carriers move directionally and in a beam shape (curved or straight) in the chamber in a charge carrier exit direction.

The charge carrier beam source 10 has a first electrode 16 and a second electrode 14 for extracting electrical charge carriers in order to extract, accelerate, and optionally deflect the charge carriers from the carrier generation area 20 in a predetermined direction. The electrodes 14, 16 have an electrically conductive material, for example graphite, in at least some regions. An electric potential $V_t$ may be applied to the electrodes 14, 16 so that charge carriers may be extracted and accelerated or charge carrier (sub) beams may be blocked. When a potential is applied to the individual electrodes, charge carriers may pass through the through-holes of the electrodes as charge carrier (sub) beams. Usually, at least two electrodes are provided in layers arranged one behind the other. The electrodes are referred to as plasma, screen or beam electrode 16, acceleration or acceleration electrode 14. The optional third electrode is designated as grid 3 or ground electrode (not illustrated) according to its function.

The second electrode 14 is arranged at a distance Ig from the first electrode 16. The electrodes 14, 16 each have at least one through-hole through which the charge carriers to be extracted pass. The through-holes of the electrodes 14, 16 correspond to each other. The electrodes 14, 16 are mostly planar components whose lateral dimension is many times greater than their thickness. As illustrated in FIG. 1, the first electrode 16 closest to the carrier generation area 20 has a thickness $t_s$ and the at least one through-hole has a diameter $d_s$. The through-hole extends in the thickness direction over the entire thickness of the electrode 14, 16 and allows charge carriers to pass through the electrode 14, 16. The electrode 14, 16 may have a grid shape with a plurality of through-holes that are permeable to charge carriers—the electrodes are then also referred to as grid electrodes.

In the related technique, the at least one through-hole in the first electrode 16 has a substantially uniform cylindrical shape throughout the thickness $t_s$ of the first electrode 16. In other words, in the related technique, the through-hole in the first electrode 16 has the same area in all thickness planes perpendicular to the charge carrier exit direction.

On contact with the first electrode 16, the plasma forms a plasma boundary layer of defined thickness due to the charge carrier mobilities. The plasma boundary layer thickness depends on the energy (electron temperature) and the charge carrier density (Child-Langmuir equation). From the plasma boundary layer, which also continues behind the grid holes, the charge carriers start on their way through the grid holes. According to the plasma density, a certain number of charge carriers per area starts a charge carrier current through a through-hole, and is approximately proportional to the area of the through-hole. Similarly, the charge carrier current is proportional to the extraction field strength.

At the carrier generation area 20, material is removed from the surface of the plasma electrode 16 by wearing, for example by the charge carriers impinging on the surface of the first electrode 16 (hereinafter referred to as plasma electrode 16) at the plasma boundary 18 or by oxygen. Over time, wearing reduces the thickness $t_s$ of the plasma electrode 16 or the diameter $d_s$ of the through-hole(s) of the plasma electrode 16, which may cause the field strength at the plasma boundary 18 of the plasma electrode 16 to change. This may cause the carrier current of the charge carrier (sub) beams 12 to increase, reducing the stability of the charge carrier (sub) beams and requiring regulation of the carrier current density to maintain a uniform carrier current.

In other words, in a conventional first electrode 16 with cylindrical through-holes, wear of the first electrode causes a reduction in the distance $l_e$ between the plasma boundary layer 18 and the second electrode 14. With a constant potential difference between the electrodes 14, 16, this results in an increase in the electric field strength (voltage/distance). The wearing thus causes an increase in the charge carrier extraction current.

In various embodiments, a charge carrier generation source is provided that mitigates or even completely avoids at least some of the above disadvantages.

In one aspect, there is provided a carrier generation source comprising a carrier generation area configured to provide carriers and a grid electrode, the grid electrode comprising an electrically conductive carrier, the carrier having a first side and a second side opposite the first side, the first side being directly adjacent the carrier generation area, the carrier having a plurality of through-holes extending from the first side through the carrier to the second side, the through-holes on the first side each having a first opening surface and the through-holes on the second side having a second opening surface, the first opening surface being larger than the second opening surface.

The through-holes may be configured in such a way that a usage of the cross-sectional area of the through-holes through the carrier adjusts the wearing of the grid electrode. The through-holes may thus be configured in such a way that the wear-dependent, time-dependent first opening surface is reduced by the wearing in such a way that essentially compensates the field-strength-related increase in the resulting charge carrier extraction current.

The at least one through-hole may have any shape in a plane perpendicular to the charge carrier exit direction. For example, the shape may be circular, oval, elliptical, triangular, polygonal, or irregular and may be different for different through-holes. For example, the shape of a through-hole does not change significantly over its extent from the first side to the second side of the grid electrode. However, the cross-sectional area may decrease as it extends through the carrier from the first side to the second side. In this context, "not substantially" means, for example, that while an elliptical shape of the through-hole may be maintained, the ratio of the lengths of the major and minor axes may vary across the extent of the through-hole in the charge carrier beam exit direction.

The reduction in thickness of the grid electrode of the charge carrier generation device due to wearing at the plasma interface may be compensated for by means of, for example, conically shaped through-holes in the grid electrode. As a result, the charge carrier current from the charge carrier generation device may be kept constant or substantially constant. Conically shaped through-holes may be formed in addition to cylindrically shaped through-holes in a simple manner. Any wear compensation may be realized by means of correspondingly (complexly) shaped through-holes. Non-uniform wearing of the first electrode (plasma electrode) may be taken into account, for example compensated, by adjusting the angle (conicity) and diameter of the through-hole(s).

The charge carrier generation source may have several electrodes. The electrodes have through-holes corresponding to each other. Corresponding through-holes" in different electrodes are understood in the sense of the application to mean through-holes which are arranged in different positions perpendicular to the charge carrier exit direction and which, with a corresponding potential applied to the individual electrodes, are suitable for allowing charge carriers to pass through the corresponding through-holes of the different electrodes as a charge carrier beam or charge carrier sub-beam. The other electrodes are arranged behind the grid electrode (also referred to as the first electrode) in the direction in which the charge carriers emerge.

The charge carrier generation source may have at least a first electrode and a second electrode to which different electrical potentials are applied during operation of the device. For example, the first electrode (plasma electrode or grid electrode), which closes off and shields the carrier generation area, may have a high potential applied to it that corresponds to the charge of the electrical charge carriers. As an example, if the electric charge carriers to be extracted from the carrier generation area by means of the charge carrier generation source are positively charged ions, the potential of the grid electrode is a positive potential, while the potential of the grid electrode for negative ions or electrons as charge carriers is a negative potential.

The second electrode may be used to accelerate the charge carriers from the carrier generation area in the direction of the charge carrier exit (acceleration electrode). During operation, the second electrode may be subjected to a potential that is opposite to the charge of the charge carriers with respect to the first electrode. This may result in a large potential difference between the first electrode and the second electrode.

Examples of embodiments of the invention are shown in the figures and are explained in more detail below.

Shown are

In the following detailed description, reference is made to the accompanying drawings which form part thereof and in which are shown, for illustrative purposes, specific embodiments in which the invention may be practiced. In this regard, directional terminology such as "top," "bottom," "front," "back," "frontwards," "rearwards," etc. is used with reference to the orientation of the figure(s) described. Since components of embodiments may be positioned in a number of different orientations, the directional terminology is for illustrative purposes and is not limiting in any way. It is understood that other embodiments may be used and structural or logical changes may be made without departing from the scope of protection of the present invention. It is understood that the features of the various exemplary embodiments described herein may be combined, unless otherwise specifically indicated. Therefore, the following detailed description is not to be construed in a limiting sense, and the scope of protection of the present invention is defined by the appended claims.

In the context of this description, the terms "connected," "attached" as well as "coupled" are used to describe both a direct and an indirect connection, a direct or indirect connection as well as a direct or indirect coupling. In the figures, identical or similar elements are given identical reference signs where appropriate.

Figure 2A:
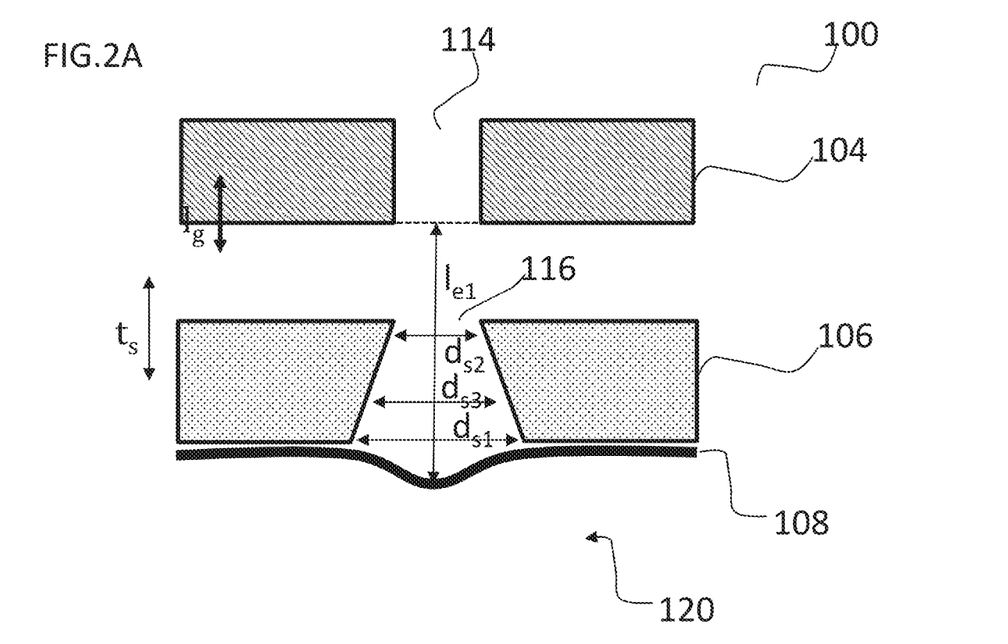
FIG. 2A is a device according to various embodiments.
Figure 2B:
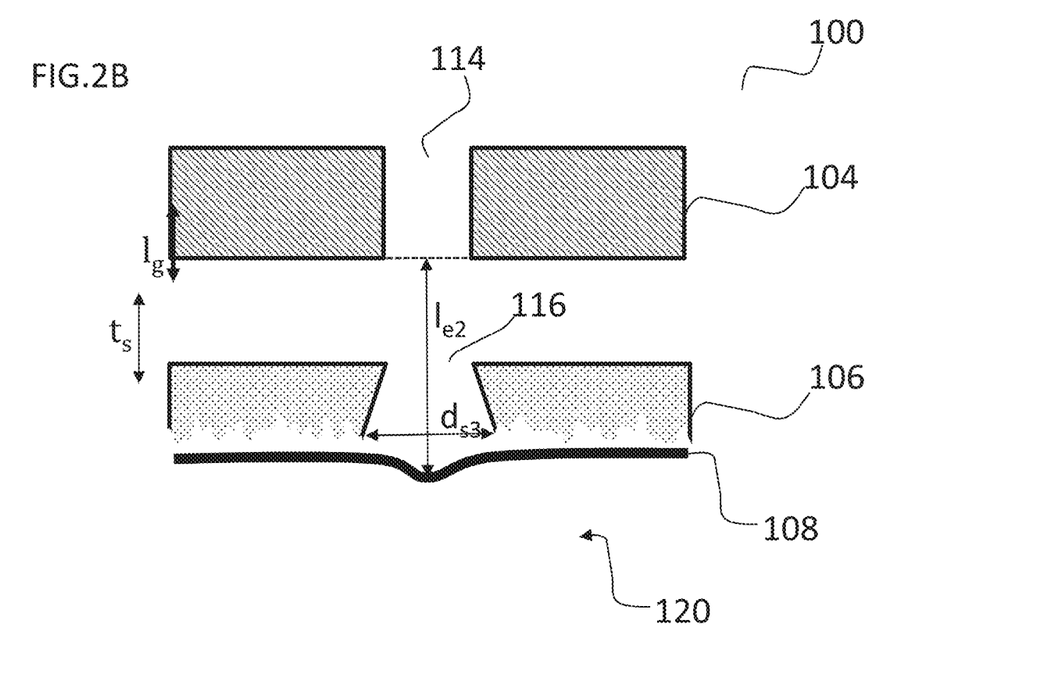
FIG. 2B is a further device according to various embodiments.

FIG. 2A and FIG. 2B schematically illustrate a charge carrier generation source 100 according to various embodiments. The charge carrier generation source 100 may include a charge carrier generation device. The carrier generation device is configured to generate a carrier plasma in the carrier generation area 120. The charge carrier plasma is illustrated in FIG. 2A and FIG. 2B by means of the plasma boundary 108.

Such a charge carrier generation source 100 is suitable, for example, for processing the surface of a substrate by means of a charge carrier beam. The charge carrier generation source 100 is configured, for example, to emit a charge carrier beam that impinges on a region (also referred to as an impingement region) of the surface of the substrate. The charge carrier generation source 100 is configured to process the surface of the substrate with a charge carrier beam, such as ablating a material of the substrate or depositing a material on the surface of the substrate. According to one embodiment, the charge carrier generation source 100 is an ion beam source and the charge carrier beam is, for example, a focusing ion beam having a Gaussian-shaped charge current distribution density. In this example, the ion beam is used to ablate a thin film from a substrate. The ion beam source may be configured as a wide beam ion beam source.

The carrier generation source 100 includes a carrier generation area 120. The carrier generation area 120 is configured to provide charge carriers. Charge carriers are, for example, ions or electrons.

The charge carrier generation source 100 further comprises a first electrode 106. The first electrode 106 is also referred to as a grid electrode 106, a plasma electrode 106, or a screen electrode 106.

The grid electrode 106 includes an electrically conductive carrier. The carrier has a first side and a second side opposite the first side. The first side is directly adjacent to the carrier generation area 120, such as the plasma boundary 108.

The carrier includes a plurality of through-holes 116. The through-holes 116 extend from the first side through the carrier to the second side. The through-holes 116 each have a first opening surface at the first side (illustrated in FIG. 2A by means of the diameter $d_{s1}$), and the through-holes 116 each have a second opening surface at the second side (illustrated in FIG. 2A by means of the diameter $d_{s2}$). The first opening surface is larger than the second opening surface.

The grid electrode 116 has a thickness $t_s$. The grid electrode 116 is configured such that the diameter $d_s$ of the opening or the opening surface of the opening at the first side of the carrier is a function of the thickness $t_s$ of the carrier, where the thickness $t_s$ is a function of time t due to wearing ($d_{s1}=f(t_s(t))$), as illustrated in FIG. 2B.

A second electrode 104 having through-holes 114 corresponding to through-holes 116 of the grid electrode 106 is disposed at a distance Ig from the grid electrode 106. The distance $l_{e1}$, $l_{e2}$ of the plasma boundary 108 to the second electrode 104 changes due to the wearing of the first electrode 106 ($l_{e1}>l_{e2}$ and $d_{s1}>d_{s3}$). In other words, by decreasing the thickness $t_s$ of the first electrode due to wearing, the plasma boundary 108 shifts towards the second electrode 104.

The second electrode 104 may be a second grid electrode 104. The second grid electrode 104 may be spaced Ig from the second side of the first grid electrode 106. The second grid electrode 104 may include one through-hole 114 or a plurality of through-holes 114. The through-holes 114 of the second grid electrode 104 may be arranged relative to the through-holes 116 of the first grid electrode 106 such that carriers from the carrier generation area 120 pass through the through-holes 116 of the first grid electrode 106 and through the through-holes 114 of the second grid electrode 104.

The through-holes are configured such that the change in the cross-sectional area of the through-hole in the carrier is configured such that when the thickness of the carrier decreases (illustratively a shift of the first side towards the second side) from the first side, there is an "independent" reduction in the opening surface of the through-hole at the first side of the carrier. Thus, a drift of the carrier extraction current may be compensated. If the through-holes are optimally designed for wearing, active control of the charge carrier extraction flow is no longer necessary. Alternatively, the control effort is reduced. Thus, a constant or substantially constant carrier current may be effectuated by reducing the opening surface on the first side of the carrier as the thickness $t_s$ of the carrier reduces over time.

The following relationships are to be taken into account:

$$J_{max} = \frac{4 \cdot \varepsilon_0}{9} \sqrt{\frac{2 \cdot e}{M}} \frac{V_t^{\frac{3}{2}}}{l_e^2} \quad (1)$$

$$I_{max} = J_{max} \cdot \frac{\pi}{4} d_s^2 \quad (2)$$

with $l_e$ as the distance of the second electrode to the plasma boundary, where Ig is given by the thickness $t_s$ of the first electrode and the distance between the first electrode and the second electrode, e as the charge of the electron, so the vacuum permittivity, $J_{max}$ the space charge-limited carrier current per through-hole, and $d_s$ the diameter of the through-hole, $V_t$ the voltage at the grid electrode, and M the mass of the charge carrier.

Figure 3A:
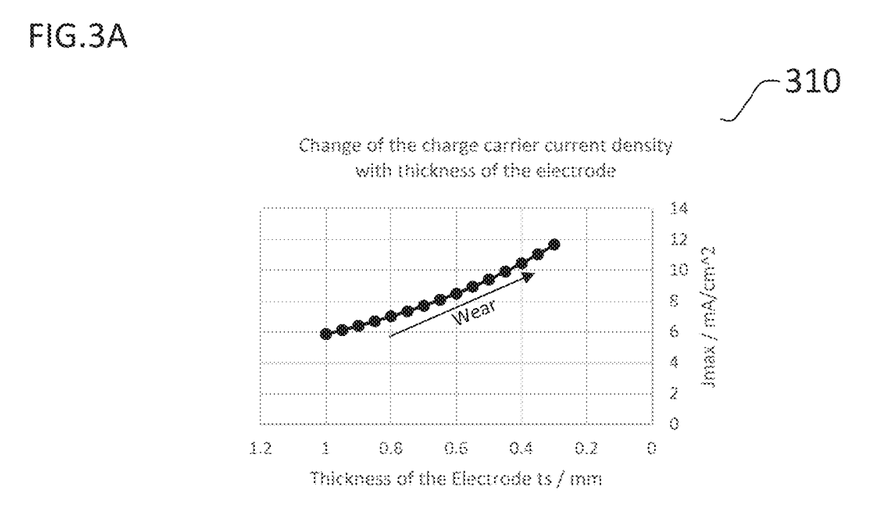
FIG. 3A is a diagram illustrating the effect of the device according to various embodiments.

For a cylindrical through-hole, the charge carrier current $J_{max}$ would increase with decreasing thickness $t_s$ of the first electrode, as illustrated in diagram 310 in FIG. 3A.

Figure 3B:
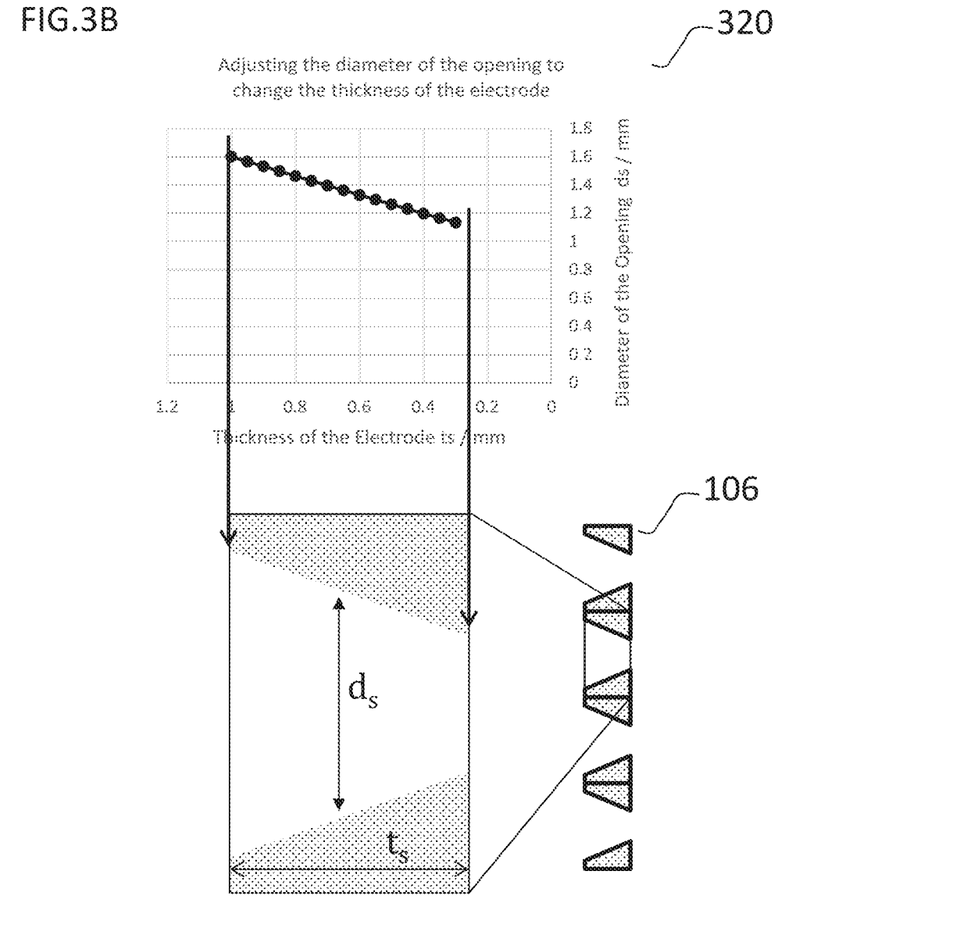
FIG. 3B is a further diagram illustrating the effect of the device according to various embodiments.
Figure 3C:
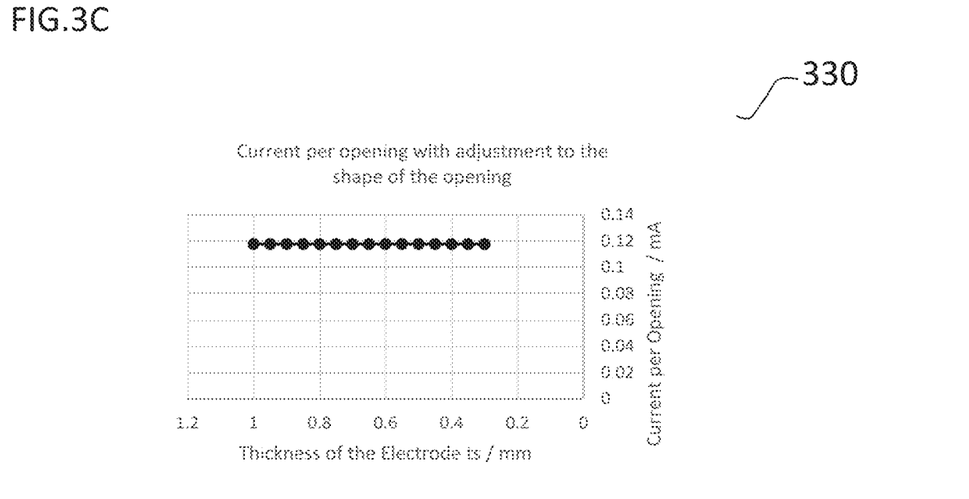
FIG. 3C is a further diagram illustrating the effect of the device according to various embodiments.

However, in various embodiments, the through-holes 116 have a shape that tapers from the first side to the second side. In various embodiments, the through-holes 116 may have a conical shape. For example, the first opening surface and/or the second opening surface may have a circular shape or a substantially circular shape. For example, the through-hole may be configured to have, for example, such cross-sectional variation ($d_s(t_s)$) as to accurately or substantially accurately compensate for the wear-induced displacement of the charge carrier flow. The opening surface at the first side of the carrier of the grid electrode 106 is thus reduced by wearing-induced decreasing thickness $t_s$, as illustrated in diagram 320 in FIG. 3B. As a result, a constant or substantially constant current of charge carriers per opening may be set as the thickness of the first electrode 106 decreases, as illustrated in diagram 330 in FIG. 3C.

In various embodiments, the charge carrier generation source 100 includes a control device. The control device is configured to form an electrical potential at the grid electrode 106. The control device may be further configured to control a flow of charge carriers from the carrier generation area 120 through the through-holes.

The control device may be further configured to apply a first electrical potential to the first grid electrode 106 and to apply a second potential, different from the first, to the second grid electrode 104.

The control device may be further configured to control the charge carrier beam. The control device may be configured to change, control, pause, abort, and/or readjust the parameters and characteristics of the charge carrier beam automatically or manually or with an appropriate combination. This may involve, for example, the position or the electrical operating currents for various components of the charge carrier generation source. Similarly, this control device may affect direct or indirect parameters of the charge carrier beam, such as characteristics of a beam neutralization device, composition and dose for output gases for the charge carrier generation source, and/or temperatures of various components. For example, an accelerating voltage may be changed, which affects the kinetic energy of the charged carriers in the charge carrier beam. The control device may further include and control or regulate a gas supply (not shown) or a plasma excitation (not shown) to the charge carrier generation source, such that the number of charge carriers in the charge carrier beam may be regulated. A gas supply may be generally required for carrier generation sources to maintain a carrier beam. Plasma excitation is generally required for charge carrier generation sources that are operated with charged charge carriers to generate the necessary charge carriers (e.g., ions) for a charged or non-neutral charge carrier beam from the supplied gas.

The control device may include a processor, computer, or other data processing device (hereinafter referred to as a process module computer PMC) that receives and evaluates the individual signals from the components and modules of the device and controls or regulates the same.

The PMC may be a freely programmable processor (for example, a microprocessor or a nanoprocessor), or hardwired logic, or firmware, or for example, an application-specific integrated circuit (ASIC) or a field-programmable gate array (FPGA). Associated with the PMC is, among other things, an axis system that is connected to a carrier beam circuit and an acceleration circuit (also referred to as an accelerator circuit) by means of a switch circuit to control the beam source carrier beam and its beam profile. The charge carrier beam circuit and the accelerator circuit may each have a power supply, which may be basically technically identical to each other. The switch circuit may each have an electrically switchable switch, such as a power transistor, between the radiation source and the charge carrier beam circuit and/or between the radiation source and the accelerator circuit. The switch circuit may be configured such that the electrical potential of the charge carrier beam circuit and/or the accelerator circuit may be electrically connected to the radiation source, or alternatively, a ground potential or other electrical potential may be connected to the radiation source.

Figure 4:
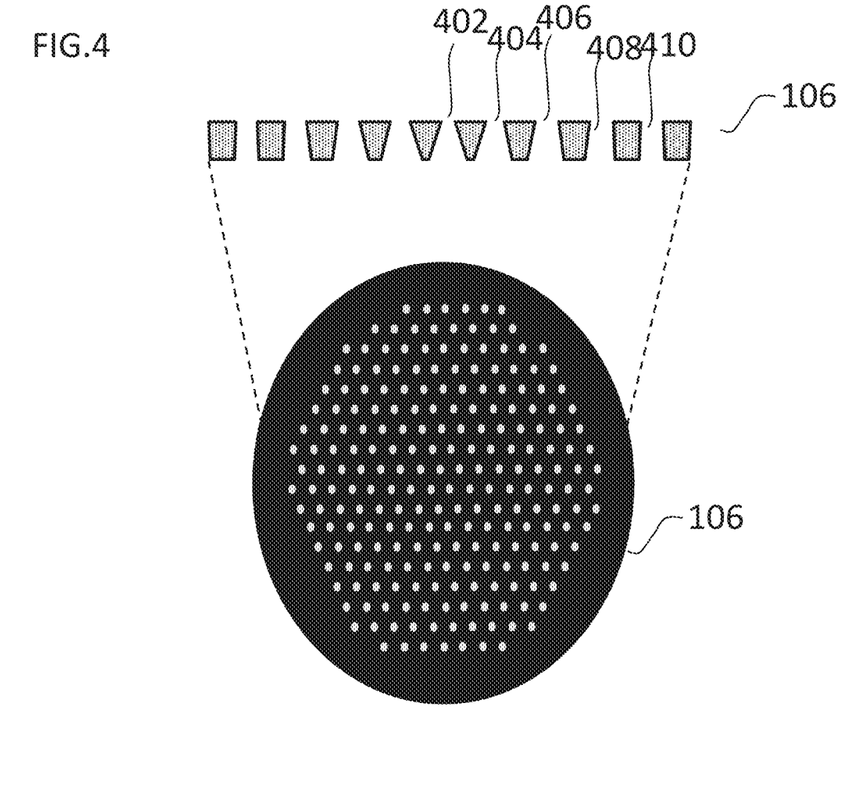
FIG. 4 is an electrode of a device according to various embodiments.

FIG. 4 illustrates a first electrode 106 of a charge carrier generation source 100 according to various embodiments. In various embodiments, the plurality of through-holes 116 may be a first plurality 402 of through-holes and the carrier may include at least a second plurality 404, 406, 408, 410 of through-holes. The through-holes of the second plurality 404, 406, 408, 410 may extend from the first side through the carrier to the second side. The through-holes of the second plurality 404, 406, 408, 410 may each have a third opening surface at the first side and the through-holes 404, 406, 408, 410 of the second plurality may have a fourth opening surface at the second side. The third opening surface may be larger than the fourth opening surface. The first opening surface may be different than the third opening surface and/or the second opening surface may be different than the fourth opening surface. The through-holes 402 of the first plurality and the through-holes 404, 406, 408, 410 of the second plurality may be concentric with each other. In various embodiments, multiple pluralities of through-holes 406, 408, 410 may be provided. The pluralities have mutually different opening surfaces on the first side and the second side of the carrier of the first electrode 106. Thus, a spatial wear profile of the first electrode 106 may be adjusted. For example, the first electrode may be configured to decrease in taper from the center of the first electrode to the edge, such as from (nearly) tapered through-hole(s) 402 at the center of the first electrode to (nearly) cylindrical through-hole(s) 410 at the edge of the first electrode, with differently shaped frustoconical through-holes 404, 406 408 laterally disposed therebetween. This enables position-independent constant charge carrier current (FIG. 3C) to be set across the surface of the first electrode. For example, in case of position-dependent wearing of the electrode. As an example, the wearing of the first electrode 106 may be more pronounced in the center than at the edge of the first electrode 106. This position-dependent wearing may be taken into account by means of position-dependent differently shaped through-holes.

The invention claimed is:

1. Charge carrier generation source, comprising
   a carrier generation area configured to provide charge carriers; and
   a grid electrode, the grid electrode comprising an electrically conductive carrier, the carrier having a first side and a second side opposite the first side, the first side being directly adjacent to the carrier generation area,
   wherein the carrier has a plurality of through-holes extending from the first side through the carrier to the second side,
   wherein the through-holes each have a first opening surface on the first side and the through-holes each have a second opening surface on the second side,
   wherein the first opening surface is larger than the second opening surface.
2. Charge carrier generation source according to claim 1, wherein the through-holes are configured such that a usage of the cross-sectional area of the through-holes through the carrier adjusts wearing of the grid electrode.
3. Charge carrier generation source according to claim 1, wherein the through-holes have a shape tapering from the first side to the second side.
4. Charge carrier generation source according to claim 1, wherein the through-holes have a conical shape.
5. Charge carrier generation source according to claim 1, wherein the first opening surface and/or the second opening surface have a circular shape or a substantially circular shape.
6. Charge carrier generation source according to claim 1, further comprising:
   a carrier generation device configured to generate a carrier plasma in the carrier generation area.
7. Charge carrier generation source according to claim 1, further comprising:
   a control device configured to form an electrical potential at the grid electrode.
8. Charge carrier generation source according to claim 1, further comprising:
   a control device configured to control a carrier flow from the carrier generation area through the through-holes.
9. Charge carrier generation source according to claim 1, wherein the grid electrode is a first grid electrode and the charge carrier generation source further comprises a second grid electrode, the second grid electrode being spaced apart ($l_g$) from the second side of the first grid electrode, the second grid electrode comprising one or a plurality of through-holes.
10. Charge carrier generation source according to claim 9, wherein the through-holes of the second grid electrode are arranged relative to the through-holes of the first grid electrode such that carriers from the carrier generation area pass through the through-holes of the first grid electrode and through the through-holes of the second grid electrode.
11. Charge carrier generation source according to claim 9, further comprising:
    a control device configured to apply a first electrical potential to the first grid electrode and to apply a second potential, different from the first, to the second grid electrode.
12. Charge carrier generation source according to claim 1, wherein the plurality of through-holes is a first plurality of through-holes and the carrier comprising a second plurality of through-holes, the through-holes of the second plurality extending from the first side through the carrier to the second side, wherein the through-holes of the second plurality each have a third opening surface at the first side and the through-holes of the second plurality have a fourth opening surface at the second side,
    wherein the third opening surface is larger than the fourth opening surface, and
    wherein the first opening surface is different from the third opening surface and/or
    wherein the second opening surface is different from the fourth opening surface.
13. Charge carrier generation source according to claim 12, further comprising:
    wherein the through-holes of the first plurality and the through-holes of the second plurality are concentric with each other.
14. Charge carrier generation source according to claim 1, further comprising:
    a plurality of pluralities of through-holes, the pluralities comprising mutually different opening surfaces on the first side and the second side.

* * * * *